United States Patent [19]

Colvin

[11] 4,390,854
[45] Jun. 28, 1983

[54] BROAD BANDWIDTH SURFACE ACOUSTIC WAVE FILTER APPARATUS WITH STAGGERED TUNING

[75] Inventor: Roger D. Colvin, Dayton, Ohio

[73] Assignee: The United States of America as represented by the Secretary of the Air Force, Washington, D.C.

[21] Appl. No.: 239,955

[22] Filed: Mar. 3, 1981

[51] Int. Cl.³ .................... H03H 9/64; H03H 9/145
[52] U.S. Cl. .................................... 333/193; 333/196
[58] Field of Search .................. 333/133, 150–155, 333/143, 193, 194, 195, 196; 310/313 R, 313 A, 313 B, 313 C, 313 D; 331/107 A; 330/5.5; 29/25.35

[56] References Cited

U.S. PATENT DOCUMENTS 3,522,557  8/1970  Duncan et al. .................... 333/143
3,858,118  12/1974  Daniel ............................ 333/193 X
3,942,140  3/1976  Laker et al. ....................... 333/193

OTHER PUBLICATIONS

"Monolithic Saw Mixer With Single Sideband Output", R. D. Colvin, Paul H. Carr, E. J. Charlson, 1978 IEEE Ultrasonics Symp. Proc. pp. 724–727.
"Stagger Tuning of Saw Filters for Broad Bandwidth and Good Shape Factor", R. D. Colvin, Paul H. Carr, G. A. Roberts, E. J. Charlson, IEEE Trans. Sonics & Ultrasonics, submitted Jan. 7, 1981.

Primary Examiner—Marvin L. Nussbaum
Attorney, Agent, or Firm—Donald J. Singer; William Stepanishen

[57] ABSTRACT

A broad bandwidth surface acoustic wave filter utilizing two broadband surface acoustic wave transducer pairs which individually comprise a single input and output. One pair of broadband surface acoustic wave (SAW) transducers is offset in frequency from a second pair of broadband SAW transducers. Each transducer is tuned with a single series inductor, and then both channels are connected electrically in parallel. The low frequency pair of transducers is tuned for maximum response below their synchronous frequency, and the high frequency pair of transducers is tuned for maximum response above their synchronous frequency.

10 Claims, 8 Drawing Figures

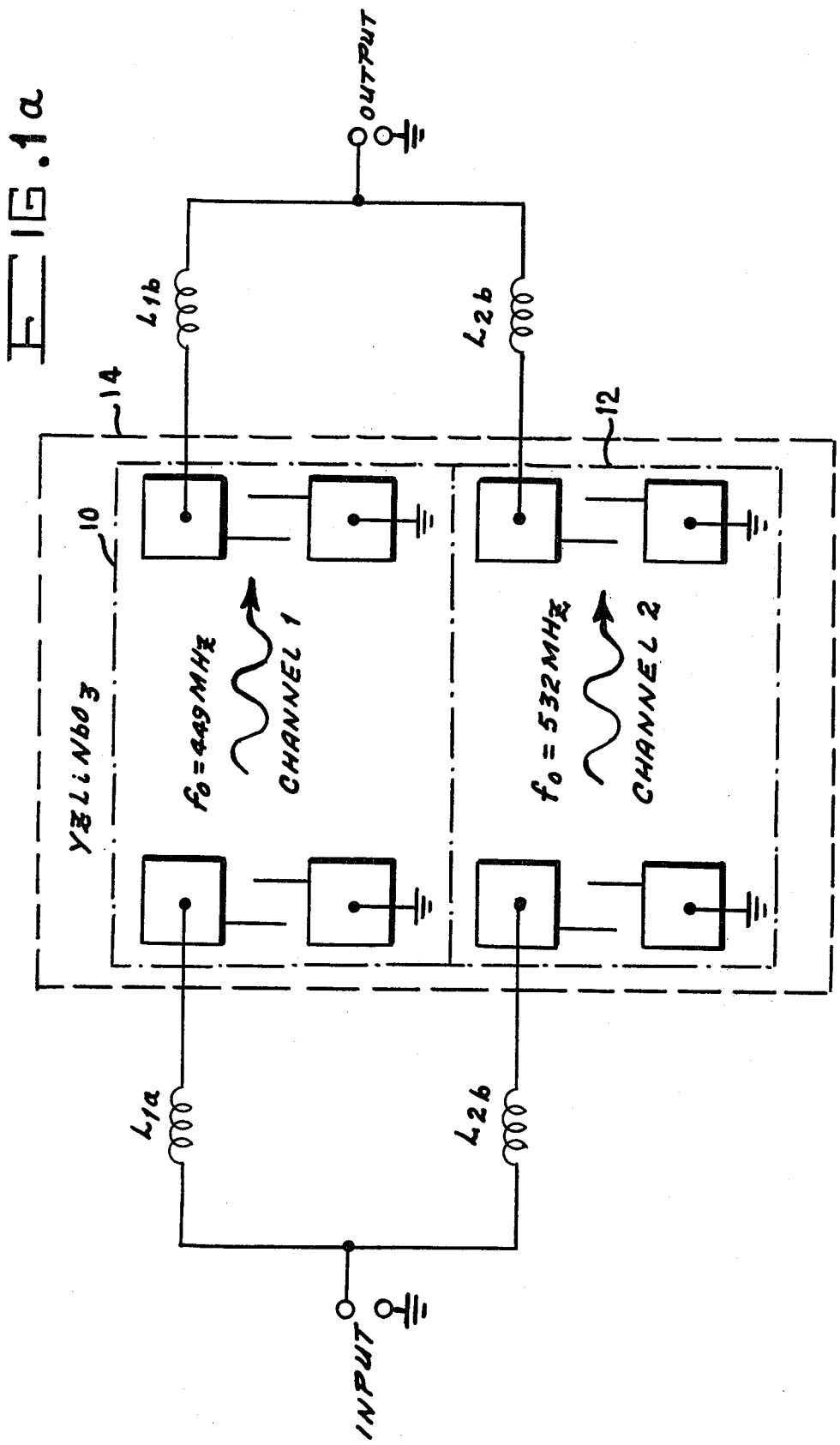

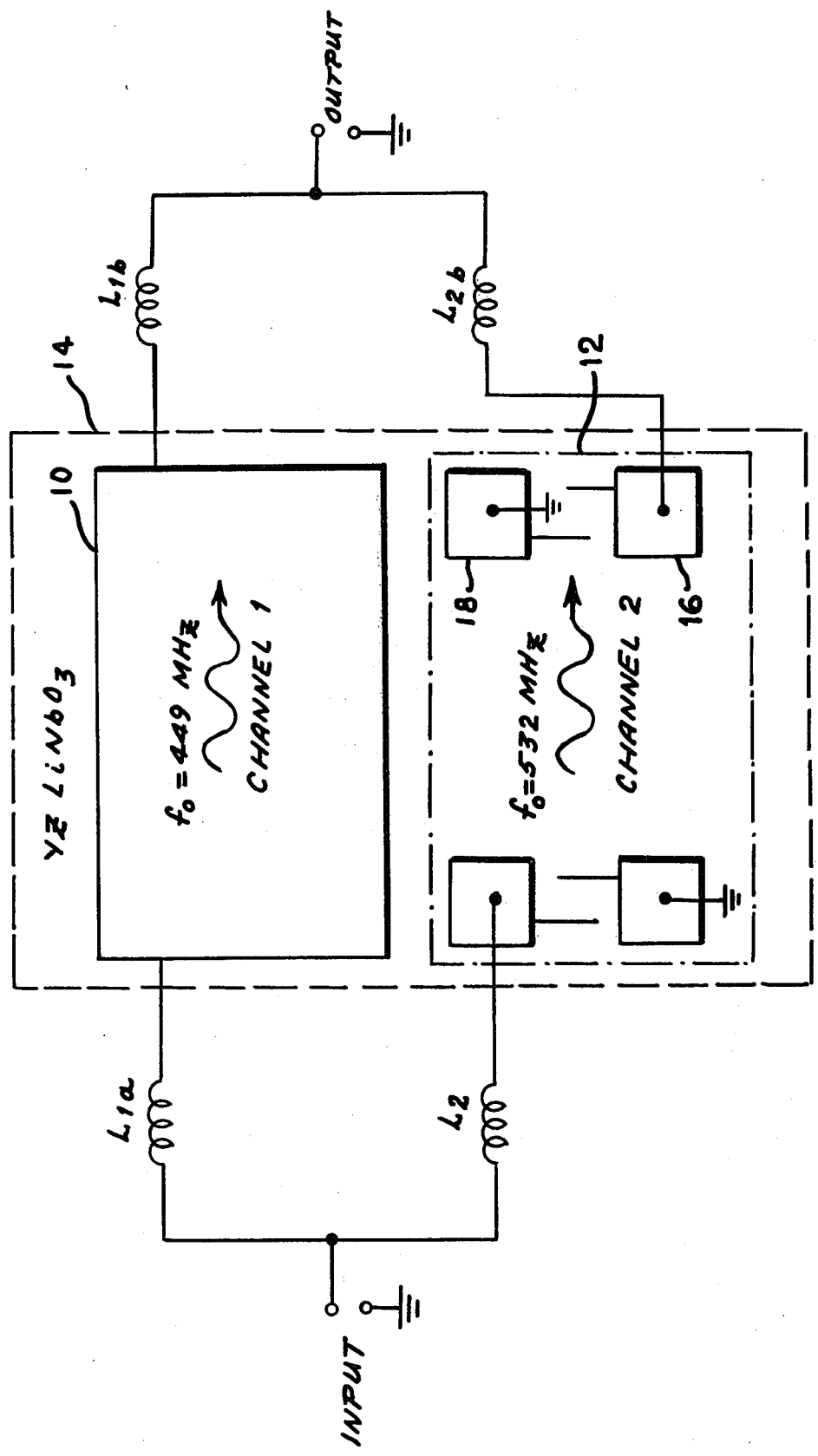

BROAD BANDWIDTH SURFACE ACOUSTIC WAVE FILTER APPARATUS WITH STAGGERED TUNING

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to surface acoustic wave filters and in particular to a stagger-tuned broad bandwidth surface acoustic wave filter apparatus.

While it is well known that surface acoustic wave (SAW) transducers may be used as filters, no prior art SAW filter has simultaneously achieved a bandwidth greater than 35 percent, a shape factor less than 1.6, and sidelobes less than 40 dB on Y,Z cut lithium niobate substrate. Other SAW filter approaches may provide better performance on one of these parameters, but none can simultaneously achieve all three parameters.

It is well known that the use of apodization with a weighting function and the three transducer approach are common techniques of obtaining good shape factor, but these techniques are only useful for less than 10 percent bandwidth. Good shape factors are obtainable from known broadband techniques. The first technique is the Reeder type matching network for a broadband unapodized transducer. This approach uses a quarter wave inverter (or lumped element equivalent) in addition to the standard series inductor. However, the bandwidth and shape factor never even approached the design goals of 48 percent bandwidth and shape factor of 1.24. A linear chirp with 400 single electrode fingers in each transducer is a possible approach to meet the desired design criteria. With this device, the resulting ripple and droop on the high frequency end may be reduced with apodization, but the shape factor is not adequate—especially on the high frequency side. The case of 200 electrodes per transducer was also considered. The frequency response does not show the droop on the high frequency end, but, as maybe expected, the shape factor was worse. Since apodization and more than 400 electrodes would be needed to attain the shape factor goal, this approach is not practical due to potential difficulties in fabrication.

A phase reversal transducer (PRT) is another approach to the problem. However, in this design as the bandwidth increases, the sidelobes also increase. In a typical example, the bandwidth may be increased to 37 percent to give a shape factor of 1.57 and sidelobes of 12 dB. Although increasing the bandwidth will further improve the shape factor but the sidelobes will degrade still further. Therefore, this approach is not particularly useful.

It is also well known that a single apodized transducer will not meet the design goals for bandwidth and shape factor simultaneously. The next attempt then was to try stagger tuning of two different broad band apodized transducers connected in parallel. While the bandwidth was realized and sidelobes were greatly reduced, however, the shape factor was similar to the linear chirp filter and did not meet the design goal.

SUMMARY OF THE INVENTION

The present invention utilizes a two channel pair of unapodized surface acoustic wave transducers to simultaneously achieve 35 percent bandwidth, 17 dB insertion loss, 1.6 shape factor, and 42 dB sidelobes on Y,Z cut lithium niobate at a center frequency of 500 MHz. One pair of broadband SAW transducers which comprise one input and one output, is offset in frequency from a second pair of broadband SAW transducers. Each transducer is tuned with a single series inductor, and then both channels are connected electrically in parallel. The low frequency channel of the surface acoustic wave (SAW) filter apparatus is tuned for maximum response below their synchronous frequency, and the high frequency channel of the surface acoustic wave (SAW) filter apparatus is tuned for maximum response above their synchronous frequency. The net result is broad bandwidth and improved shape factor. The phase relationships of the signals in the two channels when their frequency responses intersect provide a relatively flat output waveform.

It is one object of the present invention, therefore, to provide an improved broad bandwidth surface acoustic wave filter apparatus.

It is another object of the invention to provide an improved broad bandwidth surface acoustic wave filter apparatus utilizing inductors to tune the SAW transducers in a channel for maximum response either above or below their synchronous frequency.

It is another object of the invention to provide an improved broad bandwidth surface acoustic wave filter apparatus utilizing only one inductor per transducer.

It is another object of the invention to provide an improved broad bandwidth surface acoustic wave filter apparatus utilizing the precise location in frequency of nulls (traps) for both upper and lower nulls.

It is another object of the invention to provide an improved broad bandwidth surface acoustic wave filter apparatus which simultaneously achieves broad bandwidth and low shape factor.

It is another object of the invention to provide an improved broad bandwidth surface acoustic wave filter apparatus which simultaneously achieves broad bandwidth, low-shape factor, low-sidelobes, low bulk wave generation, and low insertion loss.

These and other advantages, objects and features of the invention will become more apparent after considering the following description taken in conjunction with the illustrative embodiment in the accompanying drawings.

BRIEF DESCRIPTION OF THE DRAWINGS

FIG. 1a is a schematic diagram of stagger tuned SAW filter apparatus according to the present invention;

FIG. 1b is a schematic diagram of an alternatively embodiment of the circuit in FIG. 1a;

FIG. 2 is a detailed schematic diagram of the equivalent circuit of the apparatus in FIG. 1a;

FIG. 4 is a simplified equivalent schematic for input portion of schematic diagram in FIG. 1a.

DESCRIPTION OF THE PREFERRED EMBODIMENT

Figure 2:
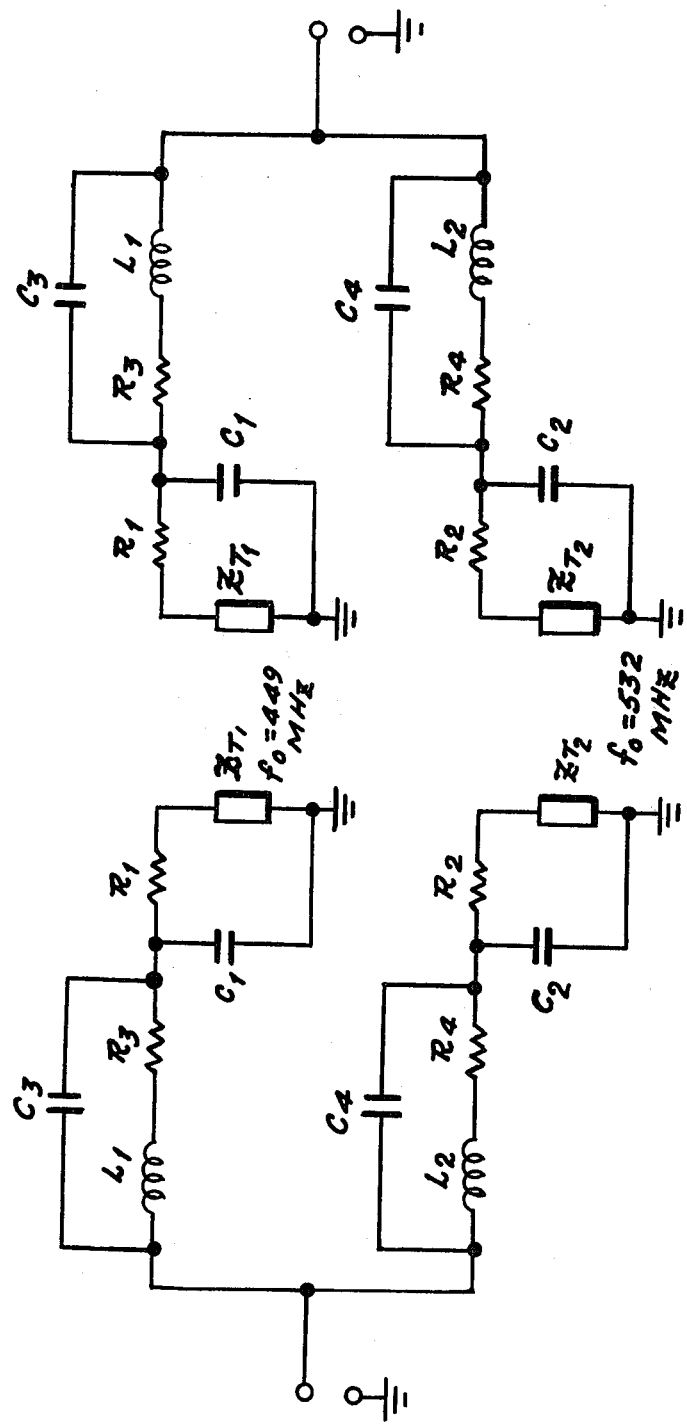

FIG. 1a is a schematic diagram of a broad bandwidth unapodized surface acoustic wave filter apparatus with staggered tuning. In the present example, the interdigital surface acoustic wave (SAW) transducers pairs 10, 12 are formed by evaporated aluminum on Y cut, Z propagating lithium niobate substrate 14. It should be well known that there are many other substrate compositions and orientations that may be used for the present filter apparatus. It may also be noted that the number of interdigital finges per transducer pair may range from two to four hundred. Transducer pair 10 which comprises channel 1 has a synchronous frequency of 449 MHz. The inductors $L_{1a}$, $L_{1b}$ which are respectively connected in the input and output circuit of a channel 1 have a value such that the maximum frequency response is obtained below the center frequency of channel 1, i.e., $f_o = 449$ MHz. Transducer pair 12 which comprises channel 2 has a synchronous frequency of 532 MHz. The inductors $L_{2a}$, $L_{2b}$ which are respectively connected in the input and output circuit of channel 2 have a value such that the maximum frequency response is obtained above the center frequency of channel 2, i.e., $f_o = 532$ MHz. While the present example present only a two channel filter apparatus, it should be noted that the present apparatus may utilize more than two channels. In such a case, each channel would have a different synchronous frequency. It may be further noted that the input and output transducers within a given channel may operate respectively at different synchronous frequencies. The inductors within a channel may or may not have the same value regardless of whether the transducers within that channel have the same synchronous frequency.

Figure 3A:
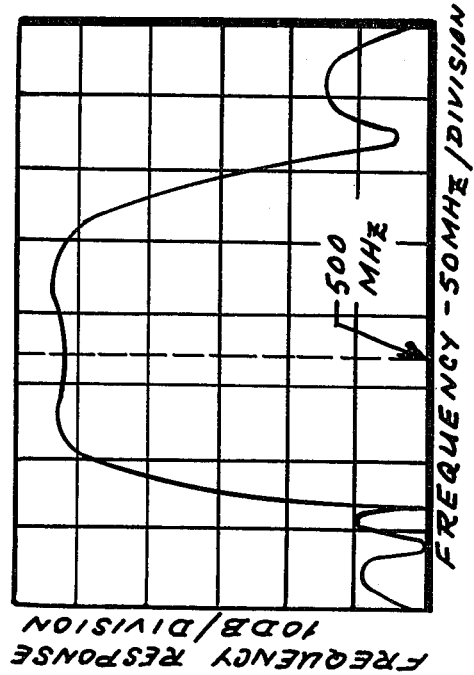
FIG. 3a is a graphical representation of each single channel response of the SAW filter apparatus.
Figure 3B:
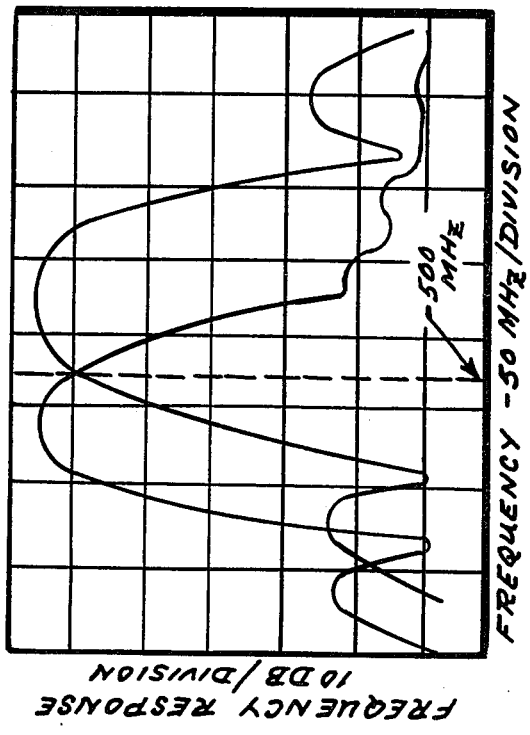
FIG. 3b is a graphical representation of the single channels.

Due to the fact channel 1 and channel 2 have different impedances where their frequency responses intersect (crossover), the signals in each channel path will have different phases. In most cases, the phases will differ by 90 to 180 degrees, and most probably will be nearer 180 degrees than 90 degrees. Thus, when the signals are combined at the output, a partial null will result at the cross over point in the frequency response. This condition is shown in FIG. 3b. There are several possible ways to compensate for this effect. Some of the ways include the use (1) use an external phase shifter, (2) use an internal phase shifter, (3) use an internal phase shift of 180 degrees.

While the last approach is only approximate, the results are adequate. This 180 degree phase shift may be introduced by taking the signal from the bottom of any one transducer and taking the signal from the top of all other transducers as shown in FIG. 1b. This approach is preferred since no additional components or phase shifters are needed. Thus, it may be seen in FIG. 1b that in channel 2 the output inductor $L_{2b}$ has been connected to the lower transducer 16 and the ground is connected to the upper transducer 18. If required, additional matching may be used after interconnecting the individual series matching inductors.

In FIG. 2, there is shown the equivalent schematic diagram for the circuit that is shown in FIG. 1a. The input circuits for both channels 1 and 2 are identical to the output circuits of both channels 1 and 2. Therefore, the description of the equivalent circuit will be directed only to the input circuit of channels 1 and 2 which differ from each other, only possible in component values. The inductor $L_{1a}$ of FIG. 1a is replaced in FIG. 2 by its equivalent circuit which comprises inductor $L_1$, resistor $R_3$ and capacitor $C_3$. The input transducer for channel 1 has been replaced by its equivalent circuit which comprises impedance $Z_{T1}$, resistor $R_1$ and capacitance $C_1$. The equivalent input circuit for channel 2 is identical to channel 1 except for the component designations.

Since the output section (right hand side) was assumed identical to the input section, and the input insertion loss must be doubled to get the total insertion loss. The impedances $Z_{T1}$ and $Z_{T2}$ are the input impedance, $S_{11}$ of the transducers. The resistors $R_1$ and $R_2$ represent the finite resistivity of the aluminum electrodes in the interdigital transducers. The capacitors $C_1$ and $C_2$ are the equivalent shunt capacitance due to bond wires going to the inductors and the transducers. The components $L_1$, $R_3$ and $C_3$ comprise the equivalent circuit of a real inductor as do components $L_2$, $R_4$, and $C_4$ for a different inductor.

Figure 3C:
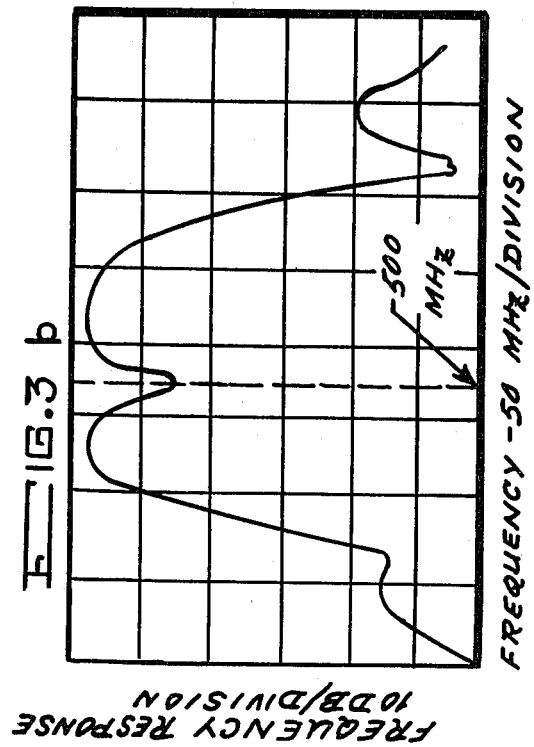
FIG. 3c is a graphical representation of the combined frequency response of the two single channels of the SAW filter apparatus except one channel has 180 degrees phase shift.

In order to establish a reference point, the two frequency channels were connected in parallel without inductors $L_1$ through $L_2$ as shown on FIG. 1a. The transducer patterns for both channels were contained on the same photolithographic mask to ensure the precise alignment of the frequency channels relative to each other. The two frequency channels were operated individually with inductors $L_{1a}$ through $L_{2b}$ included. There is shown in FIG. 3a, a double exposure of the individual responses of channels 1 and 2. When the filter apparatus was connected as shown in FIG. 1a, the combined response, taken at the output, is shown in FIG. 3b. It is clear that there is a phase difference of nearly 180 degrees between the two channels which is due to the inductors. A 180 degree phase shift was introduced in one channel by bonding one of the output transducers at the bottom pad rather than the usual top pad as shown in FIG. 1b. The result is shown in FIG. 3c wherein there is obtained a very flat 35 percent bandwidth. When a variable phase shifter is added to one channel, it is possible to make the null deeper than that shown in FIG. 3b and it is also possible to make the flat response that is shown in FIG. 3c have a positive going bump of 2 dB at the crossover frequency.

Figure 3D:
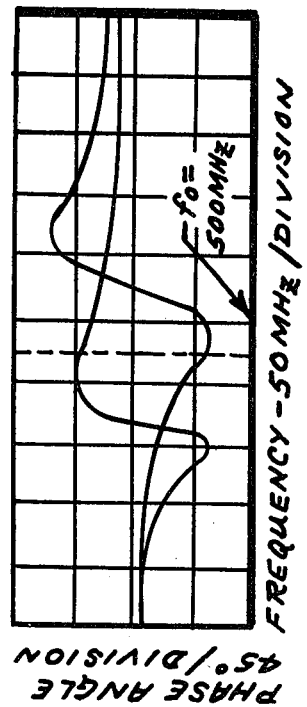
FIG. 3d is a graphical representation of the simultaneous phase relationship for each channel in the SAW filter apparatus.

The phase shift was measured with a network analyzer. The desired quantity is the phase of $S_{12}$. This parameter is not practical to measure since it undergoes many thousands of $2\pi$ rotations, and it is not necessary since the acoustic paths are identical. It is sufficient then to measure the phase of $S_{11}$ and multiply by 2 to account for $S_{22}$ since the output of each channel is identical to the input. There is shown in FIG. 3d a double exposure giving $S_{11}$ in phase only of both channels. The center line 50 denotes the cross over frequency of 474 MHz. At this point the signals are nearly 90 degrees out of phase. Thus, when this phase is multiplied by 2, the 180 degrees total phase shift is obtained. There are two other crossover frequencies at 323 MHz and 343 MHz. At these points the phases differ by about 5 degrees (or 10 degrees total). This explains the two extra nulls in FIG. 3c and their absence in FIG. 3b.

Figure 4:
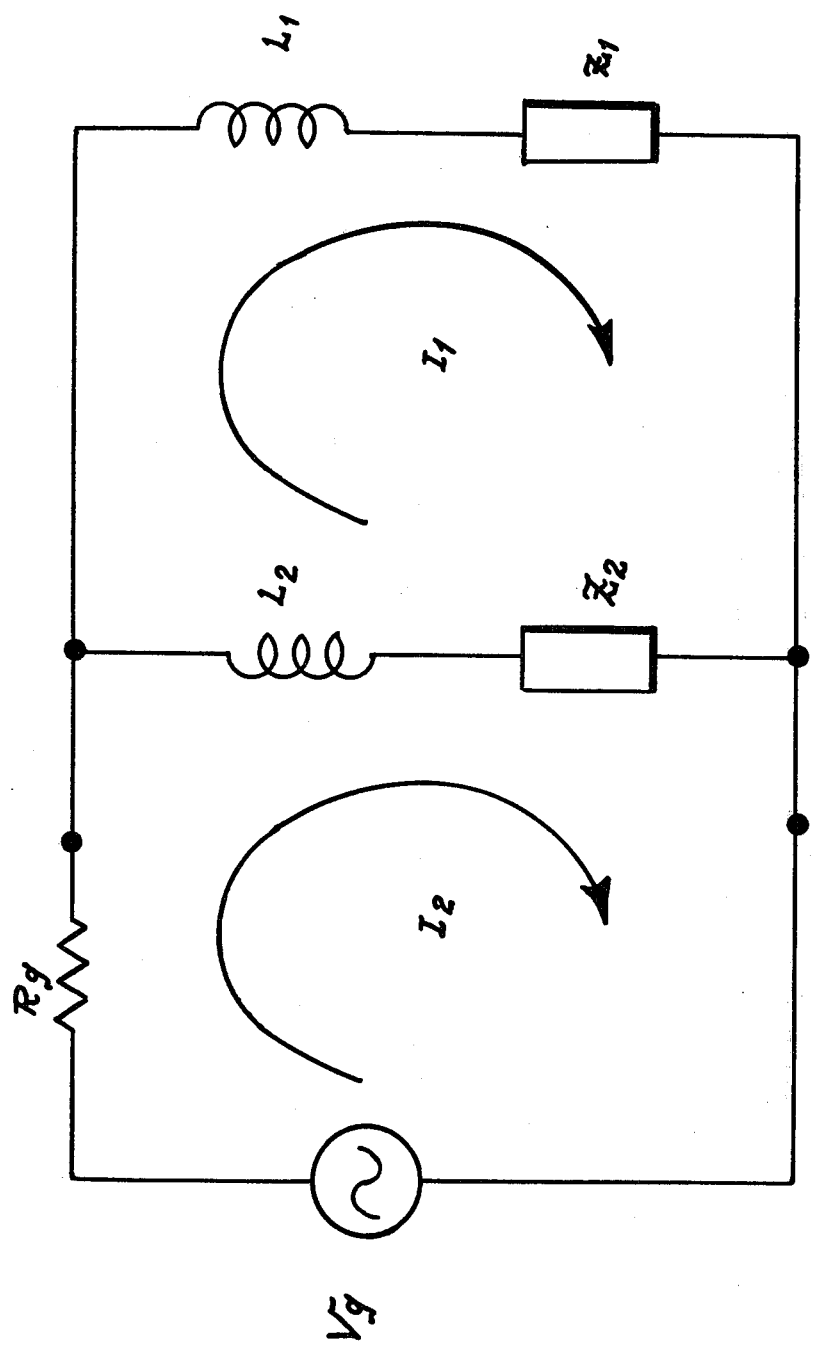

In FIG. 4, there is shown a simplified equivalent schematic for the input transducer circuits that are shown in FIG. 1a. An analysis of circuit operation utilizing the circuit in FIG. 4 is presented for the crossover frequencies of 474 MHz and 348 MHz.

This analytical model is developed to predict the measured phase differences discussed above. The input circuit that was simplified and redrawn as shown, is represented by impedances $Z_1$ and $Z_2$ which are the complex, frequency dependent impedances of the SAW transducers and $L_1$ and $L_2$ are the series matching inductors. The source voltage and internal impedance are represented by $V_g$ and $R_g$ respectively. Using the standard notation of $S_{jw}$ and assuming a steady state condition, the currents and radiating voltages are found to be $$I_1 = \frac{V_g (SL2 + Z2)}{R_g (SL1 + Z1 + SL2 + Z2) + (SL2 + Z2)(SL1 + Z1)} \quad (B1)$$

$$V_1 = I_1 \, Re(Z1) \quad (B2)$$

$$I_1 = \frac{V_g (SL2 + Z2)}{R_g (SL1 + Z1 + SL2 + Z2) + (SL2 + Z2)(SL1 + Z1)} \quad (B3)$$

$$V_2 = I_2 \, Re(Z2) \quad (B4)$$

Since the denominators are identical $$\frac{V_1}{V_2} = \frac{V_g (SL2 + Z2) \, Re(Z1)}{V_g (SL1 + Z1) \, Re(Z2)} \quad (B5)$$

It is straight forward using equation (B5) to show that the phases of the numerators in equations (B1) and (B3) will be equal when $V_1$ equals $V_2$, i.e., at the cross over frequency. It may further be shown that the numerator phases of equations (B1) and (B3) will be not only be equal but of opposite sign at the cross over frequency if the imaginary part of impedance $(Z_1)+S_{L1}$ is of opposite sign relative to the imaginary part of impedance $(Z_2)+SL_2$.

The first example is the filter that is represented in FIGS. 3a–d. The cross over frequency is 474 MHz. The quantity $SL_1+Z_1$ was measured with a network analyzer as $90+j115$. The quantity $SL_2+Z_2$ was measured to be $55-j70$. Using these values in equations (B1) to (B4) gives $$I_1 = \frac{89 \angle -51.8}{20377 \angle 6.4} = 0.0044 \angle -58.2 \quad (B6)$$

$$V_1 = I_1 \, Re(Z1) = 0.393 \angle -58.2 \quad (B7)$$

$$I_2 = \frac{146 \angle 51.9}{20377 \angle 6.4} = 0.0072 \angle 45.5 \quad (B8)$$

$$V_2 = I_2 \, Re(Z2) = 0.394 \angle 45.5 \quad (B9)$$

It man be seen that the radiated voltages, $V_1$ and $V_2$, have the same magnitude at the cross over frequency as expected. The phases of the numerators equations (B6) and (B8) are equal and of opposite sign. The phases of $V_1$ and $V_2$, differ by 103.8 degrees times 2 or 207.6 degrees. This gives a partial cancellation (6.4 dB worth) and explains why the addition of a variable phase shifter will give a deeper null. The value of 103.8 degrees agrees closely with the measured value in FIG. 3d at the center line 50 (474 MHz). The phases of $V_1$ and $V_2$, in equations (B7) and (B9), are not equal and opposite which also agrees with the measured values in FIG. 3d.

The second example is also the filter that is represented in FIGS. 3a–d but at the cross over frequency of 348 (MHz) (first null from center in FIGS. 3a, b). The quantity $SL_2+Z_1$ was measured with the network analyzer and equals $30+j200$. $SL_2+Z_2$ was measured as $20-j350$.

$$I_1 = \frac{350.6 \angle -86.7}{78991 \angle -147.9} = 0.0044 \angle 61.2 \quad (B10)$$

$$V_1 = I_1 \, Re(Z1) = 0.133 \angle 61.2 \quad (B11)$$

$$I_2 = \frac{202.2 \angle -81.5}{78991 \angle -147.9} = 0.0026 \angle 66.4 \quad (B12)$$

$$V_2 = I_2 \, Re(Z2) = 0.051 \angle 66.4 \quad (B13)$$

The voltages $V_1$ and $V_2$, in equations (B11) and (B13), should be the same amplitude but are not. The discrepancy is 8 dB which is not surprising since the filter response is extremely sharp at this point. This discrepancy is of minor importance since it is obvious that the phase differences are only going to be a few degrees anywhere in this region. In this case the difference is 5 degrees $\times 2$ (or 10 degrees total). This explains the null or absence thereof at 348 MHz and 323 MHz in FIGS. 3b, c.

The stagger tuning technique is very attractive for simultaneously achieving bandwidth greater than 35 percent, shape factor less than 1.6, insertion loss less than 18 dB, and sidelobes less than 40 dB. Other SAW filter approach can perform better for one of the parameters, but none can simultaneously achieve all four parameters. In addition the stagger tuning approach has another degree of freedom in the placement of both upper and lower nulls to create frequency traps. Finally, this approach is extendable to three or more parallel connected SAW filters.

Although the invention has been described with reference to a particular embodiment, it will be understood to those skilled in the art that the invention is capable of a variety of alternative embodiments within the spirit and scope of the appended claims.

What is claimed is:

1. A broad bandwidth filter apparatus comprising in combination:
    a piezoelectric substrate;
    a plurality of surface acoustic wave transducer pairs deposited upon said piezoelectric substrate, each transducer pair of said plurality of surface acoustic wave transducer pairs comprise an input transducer and an output transducer, each transducer pair operating at a predetermined center frequency, each transducer pair comprising a signal channel, and,
    a separate tuning means for each of said plurality of surface acoustic wave transducer pairs, each transducer pair having a tuning means connected to its input transducer and to its output transducer, said tuning means for tuning said plurality of surface acoustic wave transducer pairs above and below its center frequency, all tuning means for said input transducers connected together to receive an input signal, all tuning means for said output transducers connected together to provide an output signal.

2. A broad bandwidth filter apparatus as described in claim 1 wherein said piezoelectric substrate is Y cut and Z propagating.

3. A broad bandwidth filter apparatus as described in claim 1 wherein said piezoelectric substrate is lithium niobate.

4. A broad bandwidth filter apparatus as described in claim 1 wherein said tuning means for the input transducer of said transducer pair is the same as said tuning means for the output transducer of said transducer pair.

5. A broad bandwidth filter apparatus as described in claim 1 wherein said tuning means comprises an inductor.

6. A broad bandwidth filter apparatus as described in claim 1 wherein said plurality of surface wave transducer pairs comprises a first and second transducer pair.

7. A broad bandwidth filter apparatus as described in claim 5 wherein said inductor for said input transducer equals said inductor for said output transducer.

8. A broad bandwidth filter apparatus as described in claim 6 wherein said first transducer pair operates at a first center frequency which is lower than the second center frequency of said second transducer pair.

9. A broad bandwidth filter apparatus as described in claim 7 wherein a single inductor is utilized to tune said input transducer and a single inductor is utilized to tune said output transducer.

10. A broad bandwidth filter apparatus as described in claim 8 wherein said first center frequency is 449 MHz and said second center frequency is 532 MHz.

* * * * *